*INVENTORS*
MERLIN G. SMITH
EMANUEL STERN
BY
S. P. Tedesco
ATTORNEY

United States Patent Office 3,343,256

Patented Sept. 26, 1967

3,343,256

METHODS OF MAKING THRU-CONNECTIONS IN SEMICONDUCTOR WAFERS

Merlin G. Smith, Yorktown Heights, and Emanuel Stern, Mount Kisco, N.Y., assignors to International Business Machines Corporation, New York, N.Y., a corporation of New York Filed Dec. 28, 1964, Ser. No. 421,452
7 Claims. (Cl. 29—578)

ABSTRACT OF THE DISCLOSURE

A thru-connection is formed by opening a hole, for example, by sputtering or photoetching techniques, extending between opposite surfaces of a semiconductor wafer, wall portions of the hole and, also, annular portions of each surface continuous therewith being doped degenerately to effect a low impedance connection through the wafer. Conductor patterns and/or active devices formed on each of the opposite surfaces of the wafer are connected ohmically to the degenerately-doped portions so as to be electrically connected along the thru-connections.

This invention relates to methods for functionally integrating circuit elements formed on a planar semiconductor wafer and, more particularly, to structures defining thru-connections in the semiconductor wafer whereby circuit elements, both active and passive, formed on opposing major surfaces are interconnected.

In the present development of large and complex electronic equipments and the attendant high costs of manufacturing the same, industry is developing batch-fabrication techniques whereby large numbers of active circuit elements along with functional interconnections therebetween are formed on a single semiconductor wafer. The objective of this effort is to reduce the physical size and objectionable high cost of these equipments and, in addition, to provide reliability and optimum power utilization from the system viewpoint.

A batch-fabricated array of active and passive circuit elements formed on a semiconductor wafer is described as integrated since, generally, the semiconductor wafer forms an essential constituent of such elements and, in addition, provides structural support therefor. The micro-miniature dimensions of the active and passive circuit elements complicate the problem of providing functional connections therebetween. Generally, large arrays of circuit elements formed on a semiconductor wafer are interconnected by complex conductor patterns formed either by metalization or diffusion techniques. While present-day fabrication techniques have reduced somewhat the required number of functional interconnections, the interconnection of the circuit elements on a semiconductor wafer has been achieved only with great difficulty in view of the size factor.

Functional interconnection of circuit elements on a semiconductor wafer requires signal as well as power and ground conductor patterns. These conductor patterns are necessarily located between the circuit elements, the power and conductor patterns being multipled to each active circuit device. Accordingly, the functional interconnection of circuit devices is necessarily a three-dimensional proposition requiring numerous "crossovers," i.e., superpositioning of conductors in insulated fashion, between the different conductor patterns. The large number of "crossovers" required in large-scale integration practices looms as one of the more serious problems in the present technology. Also, space requirements of the total interconnection arrangement between the current elements must be minimal since physical size is of primary importance. For example, reduced dimensions, i.e., greater compactness of the circuit arrangement, minimize the time-distance factor of electrical signals between interconnected elements whereby operating speeds are increased. It is anticipated that the space requirements of the total interconnection arrangement may exceed 50 percent of the available surface area of the semiconductor wafer. If the space requirements of such interconnection arrangements can be reduced, a larger number of circuit elements can be formed in more compact arrangement on a semiconductor wafer of given size or, conversely, a given number of such elements can be formed on a semiconductor wafer of smaller dimensions. Such effect would provide more efficient circuit arrangements and, also, reduced manufacturing costs.

A significant portion of the space requirements of the total interconnection arrangement is demanded by the power and ground conductor patterns, such conductors generally being formed of wider metallic patterns than are the signal conductors. Moreover, since power and ground conductor patterns are multipled to each circuit element, their presence materially increases the total number of "crossovers" required to integrate the circuit elements. For example, to interconnect an array of about 200 circuit elements when the total interconnection arrangement is supported on a same major surface of the semiconductor wafer, approximately one-half of the required "crossovers," e.g., roughly 2000, result from the presence of the power and ground conductor patterns which must be crossed by the individual signal conductors. Relocation of the power and ground conductor patterns to the opposite major surface of the semiconductor wafer would significantly reduce the number of required "crossovers" and, also, more importantly, substantially reduce the space requirements of the total interconnection arrangement so as to achieve more compact arrangements of the circuit elements.

It is within the contemplation of this invention, therefore, to reduce the space requirements of the total interconnection arrangement by providing thru-connections between major surfaces of the semiconductor wafer whereby the constituent conductor patterns can be distributed over both major surfaces of the semiconductor substrate. Thru-connections have been formed in the prior art, for example, by solid degenerately-doped zones extending between the major surfaces of the semiconductor wafer. Conductive patterns and/or circuit elements formed on opposite major surfaces, respectively, of the semiconductor wafer are ohmically interconnected to a same degenerately-doped zone. While such techniques allow for redistribution of the conductor patterns, such techniques have inherent limitations. For example, the time required to diffuse prior art thru-connections can be prohibitive, e.g., in excess of 36 hours in a semiconductor wafer of 7 mils thickness. More importantly, such thru-connections require large surface areas which severely mitigate any advantage to be derived by their use, e.g., more compact arrangement of the circuit elements on the semiconductor wafer.

Accordingly, an object of this invention is to provide a novel thru-connection between major surfaces of a semiconductor wafer.

Another object of this invention is to provide a novel thru-connection in a semiconductor wafer which is readily fabricated and having minimal space requirements.

Another object of this invention is to provide a novel thru-connection between major surfaces of a semiconductor wafer whose fabrication is compatible with that of the circuit elements, both active and passive.

Another object of this invention is to provide a novel thru-connection between major surfaces of a semiconductor wafer formed by diffusion processes.

The present invention, in brief, provides a thru-connection which is defined by an opening, or hole, extending between the major surfaces of a semiconductor wafer, the walls of said hole being degenerately-doped by a selected impurity to effect a low impedance conduction path between the said surfaces. In accordance with this invention, an array of holes in desired pattern and extending between major surfaces of the semiconductor wafer are formed, for example, by reverse-sputtering or photoetching techniques. A diffusion mask, for example, genetically-formed thin oxide layer pattern by conventional photoresist processes, is formed over the major surfaces of the semiconductor wafer such as to expose the walls of each hole and, also, small portions of said surfaces continuous therewith. The "masked" semiconductor wafer is then subjected to a diffusion process whereby the very thin surface portions of the hole wall and, also, portions of the major surfaces continuous therewith are degenerately-doped; the degenerately-doped portions providing low impedance conductive paths between the major surfaces. The space requirements of the resulting array of thru-connections, therefore, are primarily determined by the individual dimensions of the holes; moreover, such structures are formed in a relatively short time since diffusion through the entire thickness of the semiconductor wafer need not be effected. Conductor patterns and/or active devices formed on the major surfaces of the semiconductor wafer are contacted ohmically with the continuous surface portions of the major surfaces so as to be electrically connected along the common thru-connection and through the semiconductor wafer. Accordingly, the signal conductor pattern and the power and ground conductor patterns can be located on different major surfaces of the semiconductor wafer to reduce the number of "crossovers" required and, also, allow a more compact arrangement of circuit elements.

It is an advantage of this invention that the thru-connections can be formed concurrently with the diffusion of active and/or passive circuit elements on the semiconductor wafer. For example, thru-connections in accordance with this invention can be formed concurrently with conductor patterns formed by diffusion processes and, also, concurrently with the diffusion of source and drain electrodes in insulated-gate field-effect structures.

The foregoing and other objects, features and advantages of the invention will be apparent from the following more particular description of preferred embodiments of the invention, as illustrated in the accompanying drawings.

Figure 1:
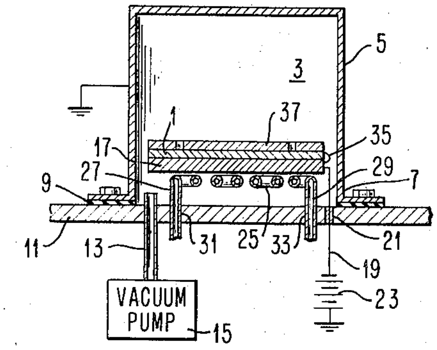
FIG. 1 illustrates a system for providing an array of holes in a semiconductor wafer by reverse-sputtering techniques.

Referring to FIG. 1, a system is illustrated utilizing reverse-sputtering techniques for providing a desired hole pattern of fine resolution in semiconductor wafer 1. Such system includes a vacuum chamber 3 which comprises a stainless-steel housing 5 having an annular flange 7. A gasket 9 is positioned between annular flange 7 and base plate 11; annular flange 7 and base plate 11 are bolted to compress gasket 9 and provide an effective vacuum seal. Exhaust pipe 13 communicates with vacuum chamber 3 and is connected at its other end to conventional vacuum pump systems 15.

A cathode 17 is positioned in the lower regions of vacuum chamber 3 and supports wafer 1; cathode 17 is connected along conductor 19 through a vacuum-feed 21 arranged in the base plate 11 to a source of negative voltage 23. For example, the cathode 17 may be biased for purposes of this invention to approximately −3000 volts, housing 5 being maintained at ground potential. Also, it is preferred that cathode 17, which may be formed of copper (Cu) or other conductive material, be cooled to dissipate heat generated by the incidence of bombarding particles during the sputtering process. Accordingly, a cooling coil 25 is positioned adjacent the lower major surface of cathode 17, input and output feeds 27 and 29, respectively, pass along vacuum-feeds 31 and 33, respectively, and base plate 11. Also, and since housing 5 serves as the anode of the sputtering apparatus, the spacing of cathode 17 from the adjacent walls of housing 5 and base plate 11 should be less than the length of the cathode dark space generated during the process; in the described process, such spacing can be approximately ⅛ inch. Accordingly, sputtering is effected only from above the upper major surface of cathode 17, requisite glow discharge conditions being inhibited adjacent the minor and lower surfaces.

Wafer 1 on which the reverse-splitting technique is to be effected is positioned on the upper major surface of cathode 17 and is electrically connected thereto along a conductor 35. An appropriate pattern of masking material 37 is formed over the upper surface of wafer 1 to define the desired hole pattern to be made therein. For example, appropriate materials for pattern mask 37 include aluminum oxide ($Al_2O_3$), silicon dioxide ($SiO_2$), etc. It has been found that such materials are sufficiently tenacious to protect the covered surfaces of wafer 1 during the sputtering process. Alternatively, aluminum (Al) may be employed to form pattern mask 37; in such event, it is preferred that the sputtering atmosphere include 0.5 percent oxygen whereby the aluminum mask is continuously oxidized during the sputtering process. As pure aluminum (Al) is easily sputtered, the continuous formation of an aluminum oxide ($Al_2O_3$) surface over the aluminum mask significantly retards sputtering thereof. Pattern mask 37 can be fabricated by conventional photoresist techniques. For example, a continuous film, in the order of 5,000 A. to 10,000 A., of aluminum oxide ($Al_2O_3$), silicon dioxide ($SiO_2$), etc., is initially formed over the surface of wafer 1 and a thin layer of appropriate photoresist material is deposited thereover. The layer of photoresist material is optically exposed through a photographic mask corresponding to the desired hole pattern. Exposed portions of the layer of photoresist material are developed, i.e., washed away by suitable solvent and remaining portions cured at an elevated temperature. A suitable etchant is applied over the remaining photoresist material and exposed portions of the continuous film whereby the latter is preferentially etched to define a hole pattern arrangement corresponding to the particular design of thru-connections to be formed in wafer 1; the remaining photoresist material is subsequently removed.

When wafer 1 has been positioned and electrically connected to cathode 17, vacuum chamber 3 is evacuated along exhaust port 13 to a sufficiently low pressure, e.g., $10^{-4}$ microns, whereby contaminating gases within the system are reduced to tolerable partial pressures. At this time, evacuation of vacuum chamber 3 is discontinued and an appropriate atmosphere for effecting the reverse-sputtering process is introduced. In the preferred method, argon (Ar) is introduced at a partial pressure of approximately 50 microns; however, numerous other atmospheres known to those skilled in the art may be substituted.

When cathode 17 is biased at −3000 volts and housing 5 is grounded, a glow discharge is struck within chamber 3, such glow discharge being initiated by the ionization of argon molecules by the free electrons within the system. These argon ions are accelerated toward cathode 17 with sufficient energy to dislodge the silicon molecules and, also, create secondary-electron emission from exposed surfaces of wafer 1. The silicon molecules, thus dislodged, diffuse through vacuum chamber 3 and a great majority thereof deposit on the interior walls of housing 5; secondary-electrons emitted from the surface of wafer 1 possess sufficient energy to ionize additional argon molecules and perpetuate the sputtering process. Continuous bombardment of exposed surface portions of the wafer 1 by the ionized argon molecules is effective to create a hole pattern through wafer 1 as defined by pattern mask 37.

Figure 2A:
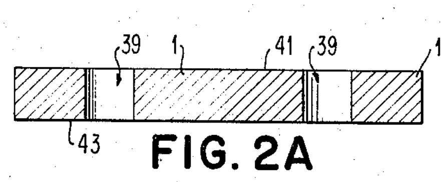
FIG. 2 illustrates a series of process steps for forming thru-connections in a semiconductor wafer.
Figure 2B:
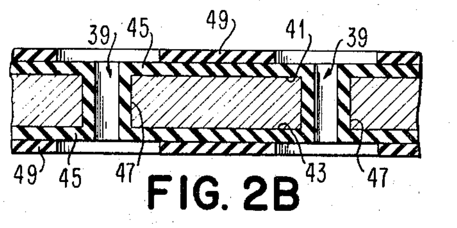

When the hole pattern has been completed, the reverse-sputtering process described with respect to FIG. 1 is terminated and pattern mask 37 is removed from wafer 1. Referring to FIG. 2A, wafer 1, which may be of n-type pure semiconductor material, includes a pattern of cylindrical holes 39 extending between major surfaces 41 and 43. The reverse-sputtering process affords sufficient definition to minimize the radial dimensions of holes 39 so as to conserve the surface area of wafer 1. Wafer 1 is subjected to a thermal-oxidation process to grow a thin oxide layer 45, e.g., between 5,000 A. and 10,000 A., over the exposed major surfaces 41 and 43 and, also, the walls 47 of the individual holes 39. As hereinafter described, thin oxide layer 45 is utilized as a diffusion mask for the degenerate-doping of walls 47, as hereinafter described. For example, thin oxide layer 45 is thermally-grown by exposing wafer 1 to an atmosphere of either oxygen ($O_2$), water vapor ($H_2O$), oxygen and water vapor ($O_2+H_2O$), or carbon dioxide ($CO_2$) at an elevated temperature between 950° C. and 1150° C. When oxide layer 45 has been formed, conventional photoresist techniques are employed to define, at least, the required pattern of openings, or "windows," therein for diffusing thru-connections in wafer 1; also, additional openings may be concurrently defined in oxide layer 45 for providing degenerately-doped patterns required for active and/or passive circuit elements. For example, a thin layer of photoresist material 49 is formed over oxide layer 45 and exposed through a photographic mask plate such that photoresist material over narrow annular portions of major surfaces 41 and 43 adjacent the rims of holes 39 are unexposed. The layer of photoresist material 49 is then developed and cured, as shown in FIG. 2B, such that oxide layer 45 along walls 47 of each hole 39 and over the described portions of major and minor surfaces 41 and 43 are exposed. A suitable etchant, e.g., hydrofluoric acid (HF), is applied over the remaining pattern of photoresist material, and, also, exposed portions of the oxide layer 45 whereby exposed portions of the latter are etched and the underlying surfaces of the wafer 1 exposed. It is evident that if degenerately-doped diffusion patterns are required for active and/or passive circuit elements on the surface of wafer 1, diffusion "windows" can be similarly provided in the oxide layer 45 to allow the concurrent diffusion of these patterns and the thru-connection now to be described.

Figure 2C:
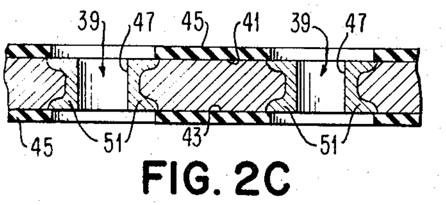

As illustrated in FIG. 2C, the exposed photoresist material 49 is removed by appropriate solvents and wafer 1 along with the oxide "diffusion mask" layer 45 is exposed, for example, to gaseous phosphorus pentoxide ($P_2O_5$) at an elevated temperature in the range of 1050° C. Accordingly, degenerately-doped p-type diffusions 51 continuous along wall 47 of each hole 39 and the annular portions of major surfaces 41 and 43 continuous therewith are formed which define thru-connections in accordance with this invention. The thru-connection thus formed, provides a low impedance conductive path between major surfaces 41 and 43 of wafer 1 and isolation is provided by the defined "p-n" junction when wafer 1 is appropriately biased. As diffusion is effected along very narrow surface regions, e.g., 2 microns, of exposed portions of wafer 1, the thru-connection is readily formed.

Figure 2D:
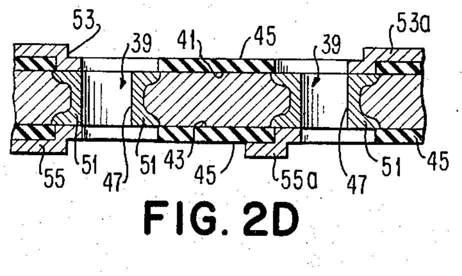

As illustrated, in FIG. 2D, thin film conductor patterns 53, **53*a*, 55, and 55*a* can be deposited over oxide layer 45 on opposing major surfaces 41 and 43, respectively, of wafer 1 and each defining ohmic contact with diffusions 51, respectively. Conductors 53, 53*a*, 55, and 55*a* can be formed by conventional metallization processes employing photoresist techniques, as well known in the art. For example, conductor patterns 55 and 55*a* over major surface 43 of wafer 1 correspond to required power and ground conductor patterns, respectively, in the integrated complex and are connected along diffusions 51 and conductor patterns 53 and 53*a*, respectively, to active circuit elements, not shown, formed on major surface 41; alternatively, degenerately-doped surface portions of major surface 41** can be electrically integral with degenerately-doped diffusions of such circuit elements.

Figure 3A:
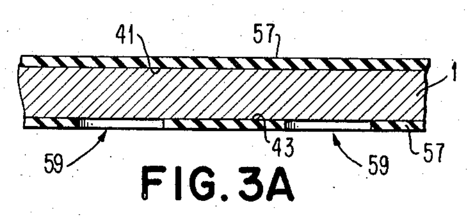
FIG. 3 illustrates a series of process steps for forming thru-connections in a semiconductor wafer by photoetching techniques.
Figure 3B:
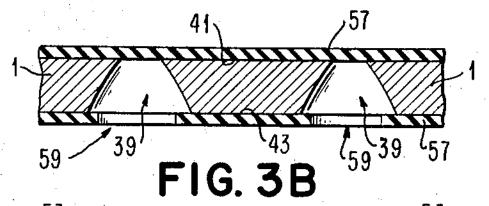
Figure 3C:
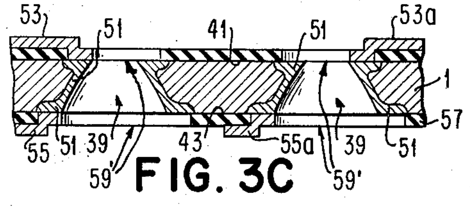

An alternative method for forming thru-connections of this invention is illustrated in FIGS. 3A, 3B, and 3C wherein photoetching techniques are employed in lieu of the reverse-sputtering technique to form the desired pattern of holes 39 in wafer 1. As illustrated in FIG. 3A. wafer 1 is thermally-oxidized, as hereinabove described, to form a thin oxide layer 57 over major surfaces 41 and 43. Conventional photoresist techniques are employed to define a pattern of circular openings 59 in oxide layer 57 over portions of major surface 43 of wafer 1 where thru-connections are to be formed. Wafer 1 with the oxide "diffusion mask" layer 57 is exposed to a gaseous etchant, hydrochloric acid (HCl), whereby exposed portions of the wafer are etched to define holes 39 extending between major surfaces 43 as shown in FIG. 3B. As illustrated, "etched" holes 39 are tapered due to the peculiarities of the etching process as obvious to those skilled in the art. Accordingly, etching of holes 39 is effected from major surface 43 of wafer 1 to minimize space required of the individual thru-connections on major surface 41 whereon active devices are preferably formed. It is, of course, evident that etching of holes 39 can be effected by providing registered openings 59 in oxide layers 57 over both major surfaces 41 and 43 of wafer 1.

When holes 39 have been opened in wafer 1, photoresist techniques are employed to define enlarge openings 59′ to expose narrow annular surface portions of major surfaces 43 and 41 continuous with the walls of openings 39. Subsequently, wafer 1 with oxide "diffusion mask" layer 57 is exposed to a gaseous atmosphere of phosphorous pentoxide ($P_2O_5$) at an elevated temperature, as hereinabove described, whereby degenerately-doped p-type diffusions 51 are effected continuous along the exposed annular portions of major surfaces 41 and 43 and walls 47 of holes 39 whereby the thru-connection is defined in similar manner as described with respect to FIGS. 2C and 2D. Subsequently, conductor patterns 53, **53*a*, 55, and 55*a*** can be formed by conventional metallization techniques.

While the invention has been particularly shown and described with reference to preferred embodiments thereof, it will be understood by those skilled in the art that various changes in form and details may be made therein without departing from the spirit and scope of the invention.

What is claimed is:

1. The method of forming a thru-connection between conductive patterns formed over opposite surfaces of a semiconductor wafer of first conductivity type material comprising the steps of providing an opening in said semiconductor wafer extending between said opposite surfaces, degenerately-doping wall portions of said opening to define second conductive type material, forming a plurality of conductive patterns over and insulated from each of said opposite surfaces of said semiconductor wafer, and ohmically connecting a selected one of said conductive patterns thus formed on each of said opposite surfaces to said degenerately-doped wall portions of said opening whereby electrical continuity is provided between said selected conductive patterns.

2. The method as defined in claim 1 comprising the additional steps of degenerately-doping regions of said opposite wall continuous with said surface portions of said opening, and ohmically contacting said selected conductive patterns and said degenerately-doped regions of said opposite surfaces.

3. A method of forming a pattern of thru-connections for interconnecting conductive patterns formed over opposite surfaces of a semiconductor body of first conductivity type material comprising the steps of defining a desired pattern of openings in said semiconductor body and extending between said opposite surfaces, masking selected portions of each of said opposite surfaces of said semiconductor body so as to expose distinct surface portions thereof each continuous with the wall portions of one of said openings, exposing said semiconductor body to gaseous dopant material while masked so as to degenerately-dope and convert the wall portions of said openings along with said distinct surface portions to opposite conductivity type material whereby a "p-n" junction is defined therebetween and remaining portions of said semiconductor body, forming a plurality of conductive patterns over and insulated from each of said opposite surfaces of said semiconductor body, and ohmically connecting selected ones of said conductive patterns formed over said opposite surfaces of said semiconductor body to a selected one of said distinct surface portions to provide electrical continuity therebetween.

4. The method of forming thru-connections for interconnecting conductive patterns formed over opposite surfaces of a semiconductor body of first conductivity type comprising the steps of masking at least one of said opposite surfaces to expose portions thereof whereat thru-connections are to be formed, removing exposed portions of said wafer to define openings extending between said opposite surfaces, masking selected portions of each of said opposite surfaces extending between the wall portions of said openings and exposing the said wall portions of said openings thus formed to a gaseous dopant atmosphere whereby said wall portions of said openings are degenerately-doped and converted to opposite conductivity type, forming a plurality of conductive patterns over and insulated from each of said opposite surfaces of said semiconductor body, and ohmically connecting selected ones of said conductive patterns formed over said opposite surfaces of said semiconductor body to the wall portions of a selected one of said holes to provide electrical continuity therebetween.

5. The method as defined in claim 4 comprising the additional step of providing a diffusion mask so as to expose the wall portions of each of said openings and, in addition, to expose distinct regions of said opposite surfaces each continuous with the wall portion of one of said openings whereby a low impedance conduction path is provided along said distinct surface regions and the wall portions of said one opening between said different surfaces.

6. The method of forming thru-connections for interconnecting conductive patterns formed over opposite surfaces of a semiconductor body of first conductivity type comprising the steps of masking at least one of said opposite surfaces to expose portions thereof whereat thru-connections are to be formed, employing reverse-sputtering techniques to remove exposed portions of said wafer to define openings extending between said opposite surfaces, masking selected portions of each of said opposite surfaces extending between the wall portions of said openings, and exposing said wall portions of said openings thus formed to a gaseous dopant atmosphere whereby said wall portions of said openings are degenerately-doped and converted to opposite conductivity type, forming a plurality of conductive patterns over and insulated from each of said opposite surfaces of said semiconductor body, and ohmically connecting selected ones of said conductive patterns formed over said opposite surfaces of said semiconductor body to the wall portions of a selected one of said holes to provide electrical continuity therebetween.

7. The method of forming thru-connections for interconnecting conductive patterns formed over opposite surface of a semiconductor body of first conductivity type comprising the steps of masking at least one of said opposite surfaces to expose portions thereof whereat thru-connections are to be formed, employing photoetching techniques to remove exposed portions of said wafer to define openings extending between said opposite surfaces, masking selected portions of each of said opposite surfaces extending between the wall portions of said openings, and exposing said wall portions of said openings thus formed to a gaseous dopant atmosphere whereby said wall portions of said openings are degenerately-doped and converted to opposite conductivity type, forming a plurality of conductive patterns over and insulated from each of said opposite surfaces of said semiconductor body, and ohmically connecting selected ones of said conductive patterns formed over said opposite surfaces of said semiconductor body to the wall portions of a selected one of said holes to provide electrical continuity therebetween.

References Cited

UNITED STATES PATENTS

| | | | |
|---|---|---|---|
| 3,041,213 | 6/1962 | Anderson | 148—189 X |
| 3,044,909 | 7/1962 | Shockley | 148—187 X |
| 3,158,788 | 11/1964 | Last | 29—155.5 |
| 3,183,128 | 5/1965 | Leistiko | 148—186 |
| 3,183,129 | 5/1965 | Tripp | 148—186 |
| 3,242,395 | 3/1966 | Goldman | 148—188 X |
| 3,256,587 | 6/1966 | Hangsteter | 29—155.5 |
| 3,271,286 | 9/1966 | Lepselter | 204—192 |

HYLAND BIZOT, *Primary Examiner.*